United States Patent
Petz et al.

(10) Patent No.: US 9,893,282 B2
(45) Date of Patent: Feb. 13, 2018

(54) METHODS OF FORMING RESISTIVE MEMORY ELEMENTS

(71) Applicant: Micron Technology, Inc., Boise, ID (US)

(72) Inventors: Christopher W. Petz, Boise, ID (US); Yongjun Jeff Hu, Boise, ID (US); Scott E. Sills, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/369,427

(22) Filed: Dec. 5, 2016

(65) Prior Publication Data

US 2017/0133587 A1    May 11, 2017

Related U.S. Application Data

(62) Division of application No. 14/935,196, filed on Nov. 6, 2015, now Pat. No. 9,553,263.

(51) Int. Cl.

| | |
|---|---|
| *H01L 45/00* | (2006.01) |
| *C23C 14/06* | (2006.01) |
| *C23C 14/34* | (2006.01) |
| *C23C 14/18* | (2006.01) |
| *C23C 14/08* | (2006.01) |
| *C23C 16/455* | (2006.01) |
| *C23C 16/34* | (2006.01) |
| *C23C 16/36* | (2006.01) |
| *C23C 16/40* | (2006.01) |

(52) U.S. Cl.
CPC ...... *H01L 45/1616* (2013.01); *C23C 14/0641* (2013.01); *C23C 14/0664* (2013.01); *C23C 14/08* (2013.01); *C23C 14/18* (2013.01); *C23C 14/34* (2013.01); *C23C 16/34* (2013.01); *C23C 16/36* (2013.01); *C23C 16/40* (2013.01); *C23C 16/45525* (2013.01); *H01L 45/04* (2013.01); *H01L 45/06* (2013.01); *H01L 45/085* (2013.01); *H01L 45/14* (2013.01); *H01L 45/141* (2013.01); *H01L 45/145* (2013.01); *H01L 45/1625* (2013.01)

(58) Field of Classification Search
CPC .......... H01L 45/06; H01L 45/04; H01L 45/14
See application file for complete search history.

(56) References Cited

U.S. PATENT DOCUMENTS

| | | |
|---|---|---|
| 7,728,322 B2 | 6/2010 | Kozicki |
| 8,134,139 B2 | 3/2012 | Lin et al. |
| 8,981,334 B1 | 3/2015 | Schubert et al. |
| 9,149,473 B2 | 10/2015 | Ecker et al. |
| 9,209,388 B2 | 12/2015 | Petz et al. |
| 9,287,356 B2 | 3/2016 | Bertin et al. |
| 2006/0171200 A1 | 8/2006 | Rinerson et al. |

(Continued)

*Primary Examiner* — Ngan Ngo
(74) *Attorney, Agent, or Firm* — TraskBritt

(57) ABSTRACT

A resistive memory element comprises a first electrode, an active material over the first electrode, a buffer material over the active material and comprising longitudinally extending, columnar grains of crystalline material, an ion reservoir material over the buffer material, and a second electrode over the ion reservoir material. A memory cell, a memory device, an electronic system, and a method of forming a resistive memory element are also described.

16 Claims, 8 Drawing Sheets

(56) References Cited

U.S. PATENT DOCUMENTS

| | | |
|---|---|---|
| 2009/0065769 A1 | 3/2009 | Yukawa et al. |
| 2009/0231906 A1* | 9/2009 | Rinerson ............ G11C 11/5685 365/151 |
| 2011/0121254 A1 | 5/2011 | Dressler et al. |
| 2012/0075914 A1* | 3/2012 | Bateman ................. G11C 7/12 365/148 |
| 2012/0176832 A1 | 7/2012 | Chevallier et al. |
| 2013/0200320 A1 | 8/2013 | Goux |
| 2014/0166959 A1 | 6/2014 | Bertin et al. |
| 2016/0072046 A1 | 3/2016 | Nagase et al. |

* cited by examiner

METHODS OF FORMING RESISTIVE MEMORY ELEMENTS

CROSS-REFERENCE TO RELATED APPLICATION

This application is a divisional of U.S. patent application Ser. No. 14/935,196, filed Nov. 6, 2015, now U.S. Pat. No. 9,553,263, issued Jan. 24, 2017, the disclosure of which is hereby incorporated herein in its entirety by this reference.

TECHNICAL FIELD

Embodiments of the disclosure relate to the field of semiconductor device design and fabrication. More specifically, embodiments of the disclosure relate to resistive memory elements including buffer materials, and to related memory cells, memory devices, electronic systems, and methods of forming resistive memory elements.

BACKGROUND

Non-volatile resistive memory devices are an important element of integrated circuit devices due to their ability to store data absent a power supply. Resistive memory cells store data by switching between different resistance states. For example, for binary data storage, a high-resistance state of the resistive memory cell may be read as logical "1," while a low-resistance state of the resistive memory cell may be read as logical "0," or vice versa. Switching between resistance states may be achieved by applying different physical signals (e.g., voltage, current) across the resistive memory cell to form, at least partially remove, or repair conductive filaments in a resistive memory element therein. Forming the conductive filaments can decrease the resistance of the memory cell, removing the conductive filaments can increase the resistance of the memory cell, and repairing the conductive filaments can decrease the resistance of the memory cell once again. Conventionally, the initial formation of the conductive filaments is referred to as "forming," the at least partial removal of the conductive filaments is referred to as "resetting," and the repair of the conductive filaments is referred to as "setting."

One example of a resistive memory cell is a programmable metallization cell (PMC), also referred to as a conductive-bridging random access memory (conductive-bridging RAM) cell. In a conventional PMC, the resistive memory element includes an inert electrode, an active electrode (also referred to as an "ion reservoir material"), and an active material (also referred to as a "switchable resistance material") between the inert electrode and the active electrode. A conductive filament extending through the active material can be formed by applying a physical signal (e.g., voltage) across the electrodes to effectuate the drift (e.g., diffusion) of metal cations (e.g., copper cations, silver cations) from the active electrode, through the active material, and to the inert electrode, where the metal cations are electro-chemically reduced. The conductive filament may be removed by applying a different physical signal (e.g., a voltage with reversed polarity) across the electrodes, or may remain in place indefinitely without needing to be electrically refreshed or rewritten.

Many conventional PMCs also include a buffer material disposed between the active electrode and the active material. The buffer material can facilitate the controlled diffusion of metal cations from the active electrode into the active material, and can also limit or prevent undesirable migration of one or more material constituents from the active material into the active electrode (and/or vice versa). Conventional buffer materials are typically formed of and include a substantially amorphous material, such as a substantially amorphous chalcogenide material (e.g., aluminum telluride). Unfortunately, the material properties of conventional buffer materials can result in undesirable memory cell performance, reliability, and/or durability. For example, the amorphous materials of many conventional buffer materials have relatively low crystallization temperatures, and may readily switch from an amorphous state to a crystalline and/or semi-crystalline state during normal use and operation of a memory cell. Such switching of states can result in memory cell damage due to phase separation of different memory cell components and/or in poor memory cell endurance. In addition, the relatively low thermal stability of conventional buffer materials can negatively impact the overall thermal stability of a memory cell, limiting one or more of processing (e.g., fabrication) temperatures and operating temperatures of the memory cell. In addition, the material properties of many conventional buffer materials can result in the inconsistent (e.g., variable, random) formation of a very limited number of conductive filaments. If one or more of the very limited number of conductive filaments fails (e.g., is undesirably disrupted or destroyed), the performance and/or reliability of the memory cell can be undesirably diminished or destroyed.

A need, therefore, remains for resistive memory elements, such as resistive memory elements for PMCs, including new buffer materials that resolve one or more of the foregoing disadvantages of conventional buffer materials, as well as for memory cells, memory devices, and electronic systems including the resistive memory elements, and simple, efficient methods of forming the resistive memory elements.

DETAILED DESCRIPTION

Figure 1:
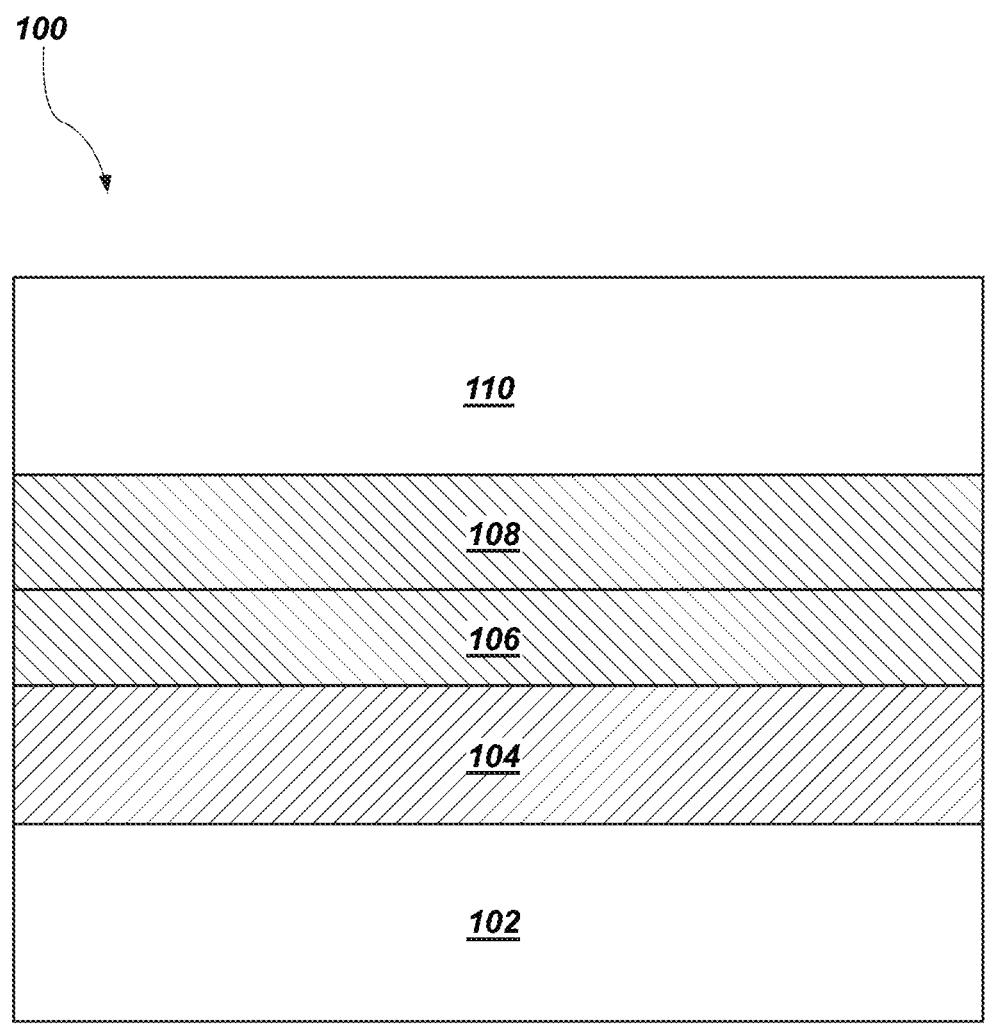
FIG. 1 is a cross-sectional view of a resistive memory element, in accordance with an embodiment of the disclosure.

Resistive memory elements including buffer materials are disclosed, as are memory cells, memory devices, electronic systems, and methods of forming resistive memory elements. In some embodiments, a resistive memory element includes a first electrode, an active material over the first electrode, a buffer material comprising longitudinally extending, columnar grains of crystalline material over the active material, an ion reservoir material over the buffer material, and a second electrode over the ion reservoir material. The longitudinally extending, columnar grains of crystalline material of the buffer material define longitudinally extending interstitial spaces that serve as metal cation diffusion pathways for the formation (and, optionally, removal) of conductive filaments within the active material. Optionally, the buffer material may also include at least one electrolyte material within the interstitial spaces to promote the diffusion of metal cations through the interstitial spaces. The buffer material may facilitate the more consistent formation of conductive filaments within an active material as compared to conventional buffer materials, increasing resistive memory element performance and/or reliability as compared to conventional resistive memory elements. In addition, the buffer material may exhibit increased thermal stability relative to conventional buffer materials, reducing the likelihood of thermal instability based damage (e.g., phase separation based damage) to a resistive memory element as compared to many conventional buffer materials. The buffer materials, resistive memory elements, and methods of the disclosure may facilitate enhanced performance, reliability, and durability in memory cells, memory devices, and electronic systems that rely on variable resistance.

The following description provides specific details, such as material types, material thicknesses, material distributions, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a memory element, memory cell, memory device, or electronic system. The structures described below do not form a complete memory cell, memory device, or electronic system. Only those process acts and structures necessary to understand the embodiments of the disclosure are described in detail below. Additional acts to form a complete memory cell, a complete memory device, and/or a complete electronic system from the structures described herein may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

An embodiment of the disclosure will now be described with reference to FIG. 1, which illustrates a resistive memory element 100 including a first electrode 102 (e.g., an inert electrode), an active material 104 (e.g., a switchable resistivity material) on or over the first electrode 102, a buffer material 106 on or over the active material 104, an ion reservoir material 108 (e.g., an active electrode) on or over the buffer material 106, and a second electrode 110 on or over the ion reservoir material 108. While FIG. 1 depicts a particular configuration of the resistive memory element 100, one of ordinary skill in the art will appreciate that different resistive memory element configurations are known in the art which may be adapted to be employed in embodiments of the disclosure. FIG. 1 illustrates just one non-limiting example of the resistive memory element 100.

The first electrode 102 may be formed of and include at least one conductive material, such as one or more of a metal, a metal alloy, a conductive metal oxide, a conductive metal nitride, a conductive metal silicide, and a conductively doped semiconductor material. By way of non-limiting example, the first electrode 102 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), carbon (C), and conductively doped silicon. In some embodiments, the first electrode 102 is formed of and includes W.

The active material 104, which may also be referred to as a "resistance variable material" or as a "switchable resistivity material," may be formed of and include at least one solid state electrolyte material switchable from one resistance state (e.g., a high-resistance state) to another resistance state (e.g., a low-resistance state) upon application of one physical signal, and switchable from the another resistance state to a different resistance state (e.g., the high-resistance state) upon application of another physical signal. Suitable solid state electrolyte materials include, but are not limited to, as metal oxide materials (e.g., transition metal oxides, dielectric metal oxides, mixed valence oxides including two or more metals), chalcogenide materials, or combinations thereof.

In some embodiments, the active material 104 is formed of and includes at least one metal oxide. As used herein, the term "metal" means and includes a refractory metal, an alkali metal, an alkaline earth metal, a transition metal, a post-transition metal, or a metalloid. If, for example, the active material 104 comprises a metal oxide, the metal component of the active material 104 may comprise at least one of chromium (Cr), cobalt (Co), hafnium (Hf), molybdenum (Mo), niobium (Nb), tantalum (Ta), titanium (Ti), tungsten (W), vanadium (V), zirconium (Zr), lanthanum (La), manganese (Mn), calcium (Ca), praseodymium (Pr), europium (Eu), silicon (Si), germanium (Ge), aluminum (Al), and nickel (Ni). By way of non-limiting example, the oxide material 106 may be at least one of silicon dioxide ($SiO_2$), an aluminum oxide ($AlO_x$), a hafnium oxide ($HfO_x$), a hafnium silicon oxide ($HfSi_yO_x$), a zirconium oxide ($ZrO_x$), a zirconium silicon oxide ($ZrSi_yO_x$), a titanium oxide ($TiO_x$), a titanium silicon oxide ($TiSi_yO_x$), a tantalum oxide ($TaO_x$), a tantalum silicon oxide ($TaSi_yO_x$), a niobium oxide ($NbO_x$), a niobium silicon oxide ($NbSi_yO_x$), a vanadium oxide ($VO_x$), a vanadium silicon oxide ($VSi_yO_x$), a tungsten oxide ($WO_x$), a tungsten silicon oxide ($WSi_yO_x$), a molybdenum oxide ($MoO_x$), a molybdenum silicon oxide ($MoSi_yO_x$), a chromium oxide ($CrO_x$), and a chromium silicon oxide ($CrSi_yO_x$). In some embodiments, the active material 104 comprises $AlO_x$. Formulae including at least one of "x" and "y" above (e.g., $AlO_x$, $HfO_x$, $HfSi_yO_x$, $ZrO_x$, $ZrSi_yO_x$, $TiO_x$, $TiSi_yO_x$, etc.) represent a composite material that on average contains x atoms of one element (e.g., oxygen) and y atoms of another element (e.g., silicon) for every one atom of the metal component. As the formulae are representative of relative atomic ratios and not strict chemical structure, the active material 104 may comprise a stoichiometric compound or a non-stoichiometric compound, and values of x and y may be integers or may be non-integers. As used herein, the term "non-stoichiometric compound" means and includes a chemical compound with an elemental composition that cannot be represented by a ratio of well-defined natural numbers and is in violation of the law of definite proportions.

In additional embodiments, the active material 104 is formed of and includes at least one chalcogenide material. As used herein, the term "chalcogenide" refers to a binary or multinary compound that includes at least one chalcogen and a more electropositive element or radical. As used herein, the term "chalcogen" refers to an element of Group VI of the Periodic Table of Elements, such as oxygen (O), sulfur (S), selenium (Se), or tellurium (Te). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide may be a binary, ternary, or quaternary alloy.

The active material 104 may exhibit any suitable thickness. By way of non-limiting example, a thickness of the active material 104 may be within a range of from about 5 Angstroms (Å) to about 200 Å, such as from about 10 Å to about 100 Å, or from about 20 Å to about 80 Å. In addition, the active material 104 may be substantially homogeneous throughout the thickness thereof, or may be substantially heterogeneous throughout the thickness thereof. In some embodiments, the active material 104 is substantially homogeneous throughout the thickness thereof. For example, the active material 104 may be formed of and include only one material (e.g., only one metal oxide material, or only one chalcogenide material). In additional embodiments, the active material 104 is substantially heterogeneous throughout the thickness thereof. For example, the active material 104 may be formed of and include a stack (e.g., laminate) of at least two different materials (e.g., at least two different metal oxide materials, at least two different chalcogenide materials, at least one metal oxide material and at least one chalcogenide material).

The first electrode 102 and the active material 104 may each independently be formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, and ionized PVD. Such processes are known in the art and, therefore, are not described in detail herein.

With continued reference to FIG. 1, the buffer material 106 may be formed of and include at least one crystalline material exhibiting substantially continuous, columnar grain boundaries. The columnar grains of the crystalline material may extend substantially perpendicular (e.g., substantially orthogonal) to an upper surface of the active material 104. Put another way, the crystalline material of the buffer material 106 may be formed of and include longitudinally (e.g., vertically) extending columnar grains. As used herein, the terms "vertical," "longitudinal," "horizontal," and "lateral" are in reference to a major plane of a structure (e.g., the first electrode 102, the active material 104) in, on, or over which one or more additional structures (e.g., the columnar grains of the crystalline material of the buffer material 106) and/or features (e.g., interstitial spaces, openings) are formed and are not necessarily defined by earth's gravitational field. A "horizontal" or "lateral" direction is a direction that is substantially parallel to the major plane of the structure (e.g., the first electrode 102, the active material 104), while a "vertical" or "longitudinal" direction is a direction that is substantially perpendicular to the major plane of the structure. The major plane of the structure is defined by a surface of the structure having a relatively large area compared to other surfaces of the structure. Interstitial spaces between the longitudinally extending columnar grains of the crystalline material provide longitudinally extending pathways for the diffusion (e.g., migration) of metal cations to and from the active material 104 for the formation and/or destruction of conductive filaments therein. For example, metal cations from the ion reservoir material 108 may diffuse along the substantially continuous, columnar grain boundaries of the crystalline material of the buffer material 106 into the active material 104.

The longitudinally extending columnar grains of the crystalline material of the buffer material 106 may exhibit substantially uniform, nanoscale diameters (e.g., widths). As used herein, the term "nanoscale" refers to a cross-section or diameter (e.g., width) of less than or equal to about one hundred (100) nanometers (nm), such as less than or equal to about 50 nm, less than or equal to about 25 nm, or less than or equal to about 15 nm, or less than or equal to about 10 nm. The diameter(s) and distribution of the longitudinally extending columnar grains may at least partially determine the amount of metal cation diffusion through the buffer material 106. In some embodiments, an average (e.g., mean) diameter of the columnar grains of the crystalline material is within a range of from about 3 nm to about 20 nm (e.g., from about 3 nm to about 15 nm, or from about 3 nm to about 10 nm). Each of the longitudinally extending columnar grains may be substantially the same (e.g., exhibit substantially the same dimensions) as each other of the longitudinally extending columnar grains, or at least one of the longitudinally extending columnar grains may be different than (e.g., exhibit different dimensions) at least one other of the longitudinally extending columnar grains. In some embodiments, the longitudinally extending columnar grains are monodisperse, such that each of the longitudinally extending columnar grains exhibits substantially the same grain size (e.g., substantially the same diameter). Put another way, a grain size distribution of the longitudinally extending columnar grains may be substantially uniform. For example, each of the longitudinally extending columnar grains may exhibit substantially the same diameter within a range of from about 3 nm to about 20 nm (e.g., substantially the same diameter within a range of from about 3 nm to about 15 nm, substantially the same diameter within a range of from about 3 nm to about 10 nm, a diameter of about 3 nm, a diameter of about 5 nm, a diameter of about 8 nm, a diameter of about 10 nm). In additional embodiments, the longitudinally extending columnar grains are polydisperse, such that at least one of the longitudinally extending columnar grains exhibits a different grain size (e.g., a different diameter) than at least one other of the longitudinally extending columnar grains. Put another way, a grain size distribution of the longitudinally extending columnar grains may be non-uniform (e.g., variable). For example, at least some of the longitudinally extending columnar grains may exhibit different diameters than one another within a range of from about 3 nm to about 20 nm (e.g., different diameters within a range of from about 3 nm to about 15 nm, different diameters within a range of from about 3 nm to about 10 nm).

As a non-limiting example, the buffer material 106 may be formed of and include one or more of at least one refractory metal nitride (e.g., one or more of titanium nitride ($TiN_x$), tantalum nitride ($TaN_x$), and tungsten nitride ($WN_x$)), at least one refractory metal nitrogen carbide (e.g., one or more of titanium nitrogen carbide ($TiN_xC_y$), tantalum nitrogen carbide ($TaN_xC_y$), and tungsten nitrogen carbide ($WN_xC_y$)), at least one refractory metal nitrogen boride (e.g., one or more of titanium nitrogen boride ($TiN_xB_y$), tantalum nitrogen boride ($TaN_xB_y$), and tungsten nitrogen boride ($WN_xB_y$)), and at least one refractory metal nitrogen silicide (e.g., one or more of titanium nitrogen silicide ($TiN_xSi_y$), tantalum nitrogen silicide ($TaN_xSi_y$), and tungsten nitrogen silicide ($WN_xSi_y$)). Formulae including at least one of "x" and "y" above (e.g., $TiN_x$, $TaN_x$, $WN_x$, $TiN_xC_y$, $TaN_xC_y$, $WN_xC_y$, $TiN_xB_y$, $TaN_xB_y$, $WN_xB_y$, $TiN_xSi_y$, $TaN_xSi_y$, $WN_xSi_y$) represent a composite material that on average contains x atoms of one element (e.g., nitrogen) and y atoms of another element (e.g., carbon, boron, or silicon) for every one atom of the metal component. As the formulae are representative of relative atomic ratios and not strict chemical structure, the refractory metal nitride, refractory metal nitrogen carbide, refractory metal nitrogen boride, and/or the refractory metal nitrogen silicide may each independently comprise a stoichiometric compound or a non-stoichiometric compound, and values of x and y may be integers or may be non-integers. The crystalline material (e.g., refractory metal nitride, refractory metal nitrogen carbide, refractory metal nitrogen boride, refractory metal nitrogen silicide) of the buffer material 106 may be thermally stable (e.g., may not undergo phase or state transitions) at temperatures of up to at least about 350° C. In some embodiments, the buffer material 106 is formed of and includes a refractory metal nitride, such as $TiN_x$. In additional embodiments, the buffer material 106 is formed of and includes a refractory metal nitrogen carbide, such as $TiN_xC_y$. Columnar grains of refractory metal nitrogen carbides (e.g., $TiN_xC_y$) may exhibit relatively smaller diameters than columnar grains of refractory metal nitrides (e.g., $TiN_x$) including the same refractory metal species (e.g., Ti), facilitating a relatively greater number of columnar grains and metal cation diffusion pathways per unit area of the buffer material 106, if desired. For example, following nucleation, carbon atoms may populate grain boundaries and restrict lateral (e.g., horizontal) grain growth. If the buffer material 106 is formed of and includes a refractory metal nitrogen carbide, the refractory metal nitrogen carbide may include any amount of carbon (C) permitting the refractory metal nitrogen carbide to be at least partially (e.g., substantially) crystalline. By way of non-limiting example, if included in the buffer material 106, a refractory metal nitrogen carbide may comprise from about 0.1 atomic percent (atomic %) C to about 25 atomic % C, such as from about 0.5 atomic % C to about 20 atomic % C, or from about 1 atomic % C to about 10 atomic % C.

Optionally, the buffer material 106 may also be formed of and include at least one electrolyte material. The electrolyte material may be dispersed within the interstitial spaces between the longitudinally extending columnar grains of the crystalline material of the buffer material 106. The electrolyte material may comprise any material that promotes the diffusion (e.g., migration) of metal cations (e.g., copper cations, silver cations, aluminum cations) through the interstitial spaces between the columnar grains of the crystalline material. The electrolyte material may enhance a rate at which the metal cations travel along the grain boundaries of the crystalline material. By way of non-limiting example, the electrolyte material may comprise at least one chalcogen, such as one or more of oxygen (O), sulfur (S), selenium (Se), and tellurium (Te). In some embodiments, the electrolyte material comprises Te. Electrolyte material may at least partially fill the interstitial spaces between the columnar grains of crystalline material. The buffer material 106 may include any amount of electrolyte material (e.g., Te) sufficient to facilitate a desired amount of metal cation diffusion through buffer material 106, such as from about 0 atomic % electrolyte material to about 50 atomic % electrolyte material (e.g., from about 0.01 atomic % electrolyte material to about 50 atomic % electrolyte material, from about 0.01 atomic % electrolyte material to about 25 atomic % electrolyte material, from about 0.01 atomic % electrolyte material to about 10 atomic % electrolyte material, or from about 0.01 atomic % electrolyte material to about 5 atomic % electrolyte material).

The buffer material 106 may exhibit any suitable thickness. By way of non-limiting example, a thickness of the buffer material 106 may be within a range of from about 5 Angstroms (Å) to about 100 Å, such as from about 10 Å to about 75 Å, or from about 15 Å to about 50 Å. In some embodiments, the thickness of the buffer material 106 is within a range of from about 15 Å to about 50 Å. In addition, the buffer material 106 may be substantially homogeneous throughout the thickness thereof, or may be substantially heterogeneous throughout the thickness thereof. In some embodiments, the buffer material 106 is substantially homogeneous throughout the thickness thereof. For example, the buffer material 106 may be formed of and include a single (e.g., only one) crystalline material (e.g., a single refractory metal nitride, such as $TiN_x$; a single refractory metal nitrogen carbide, such as $TiN_xC_y$), or may be formed of and include a single (e.g., only one) composite (e.g., complex, mixture) of crystalline material (e.g., $TiN_x$ or $TiN_xC_y$) and electrolyte material (e.g., Te). In additional embodiments, the buffer material 106 is substantially heterogeneous throughout the thickness thereof. For example, the buffer material 106 may be formed of and include a stack (e.g., laminate) of at least two different materials (e.g., at least two different crystalline materials; at least two different composites of crystalline material and electrolyte material, such as at least two composites comprising different crystalline materials and/or different electrolyte materials than one another; at least one crystalline material and at least one composite of crystalline material and electrolyte material; at least one semi-crystalline material and at least one crystalline material; at least one semi-crystalline material and at least one composite of crystalline material and electrolyte material; at least one amorphous material and at least one crystalline material; at least one amorphous material and at least one composite of crystalline material and electrolyte material; or combinations thereof). In some embodiments, the buffer material 106 is formed of and includes a single layer of $TiN_x$ and Te. In additional embodiments, the buffer material 106 is formed of and includes a single layer of $TiN_xC_y$ and Te.

The buffer material 106 may be formed on or over the active material 104 by conventional processes including, but not limited to, one or more of PVD, CVD, and ALD, which are not described in detail herein. In some embodiments, the buffer material 106 is formed on or over the active material 104 through PVD. By way of non-limiting example, a titanium source, and, optionally, at least one of a carbon source (e.g., graphite) and a tellurium source, may be provided in a deposition chamber configured to receive nitrogen gas at a desired flow rate and to generate a plasma including a noble gas element (e.g., helium, neon, argon, krypton, xenon, or radon). Conditions (e.g., temperatures, pressures) for generating and maintaining the plasma in the deposition chamber are conventional and, therefore, are not described in detail herein. As the titanium source (and, optionally, the carbon source and/or the tellurium source) is bombarded with the plasma, titanium atoms (and, optionally, carbon atoms and/or tellurium atoms) are sputtered from a surface of the titanium source (and, optionally, the carbon source and/or the tellurium source) and are deposited on or over the active material 104. Titanium atoms may chemically bond to nitrogen atoms from the nitrogen gas (and, optionally, carbon atoms from the carbon source and/or tellurium atoms from the tellurium source), forming the buffer material 106 on or over the active material 104. In additional embodiments, the buffer material 106 may be formed by co-sputtering a solid titanium nitride source concurrently with a carbon source in an inert environment (e.g. an argon environment, a neon environment, a helium environment). A desired thickness of the buffer material 106 may be achieved by controlling a deposition time and an amount of power used.

The ion reservoir material 108 may be formed of and include any material that is able to contribute metal cations that drift into the active material 104 upon application of a physical signal (e.g., voltage) across the resistive memory element 100 to form conductive filaments extending through the active material 104. By way of non-limiting example, the ion reservoir material 108 may be formed of and include one or more of copper (Cu), silver (Ag), and aluminum (Al). In some embodiments, the ion reservoir material 108 is formed of and includes Cu. Optionally, the ion reservoir material 108 may also include at least one additional material, such as at least one of a chalcogen (e.g., 0, S, Se, Te) and a more electropositive element (e.g., N, Si, Ni, Ga, Ge, As, In, Sn, Sb, Au, Pb, Bi) or radical. In some embodiments, the ion reservoir material 108 is formed of and includes Cu, and one or more of Te, Ge, and Si. By way of non-limiting example, the ion reservoir material 108 may be formed of and include a copper-tellurium (CuTe) material, a copper-tellurium-germanium (CuTeGe) material, or a copper-tellurium-silicon (CuTeSi) material. In additional embodiments, the ion reservoir material 108 is formed of and includes Ag, and one or more of Te, Ge, and Si. By way of non-limiting example, the ion reservoir material 108 may be formed of and include a silver-sulfur material (AgS), or a silver-selenium material (AgSe).

The ion reservoir material 108 may exhibit any suitable thickness. By way of non-limiting example, a thickness of the ion reservoir material 108 may be within a range of from about 5 Å ngstroms (Å) to about 200 Å, such as from about 10 Å to about 100 Å, or from about 20 Å to about 80 Å. In addition, the ion reservoir material 108 may be substantially homogeneous throughout the thickness thereof, or may be substantially heterogeneous throughout the thickness thereof. In some embodiments, the ion reservoir material 108 is substantially homogeneous throughout the thickness thereof. For example, the ion reservoir material 108 may formed of and include only one material (e.g., only one metal material, such as one of Cu and Ag; only one chalcogenide material, such as only one of CuTe, CuTeGe, CuTeSi, AgS, and AgSe). In additional embodiments, the ion reservoir material 108 is substantially heterogeneous throughout the thickness thereof. For example, the ion reservoir material 108 may be formed of and include a stack (e.g., laminate) of at least two different materials (e.g., at least two different metal materials, at least two different chalcogenide materials, at least one metal material and at least one chalcogenide material).

The second electrode 110 may be formed of and include at least one conductive material, such as one or more of a metal, a metal alloy, a conductive metal oxide, a conductive metal nitride, a conductive metal silicide, and a conductively doped semiconductor material. The second electrode 110 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively doped silicon. The material composition of the second electrode 110 may be the same as or may be different than the material composition of the first electrode 102. In at least some embodiments, the second electrode 110 is formed of and includes WN. In addition, the second electrode 110 may be formed on or over the ion reservoir material 108 to any desired thickness. The second electrode 110 may exhibit substantially the same thickness as the first electrode 102, or may exhibit a different thickness than the first electrode 102.

The ion reservoir material 108 and the second electrode 110 may each independently be formed using conventional processes (e.g., conventional deposition processes, such as at least one of in situ growth, spin-on coating, blanket coating, CVD, PECVD, ALD, and PVD) and conventional processing equipment, which are not described in detail herein.

Thus, in accordance with embodiments of the disclosure, a resistive memory element comprises a first electrode, an active material over the first electrode, a buffer material over the active material and comprising longitudinally extending, columnar grains of crystalline material, an ion reservoir material over the buffer material, and a second electrode over the ion reservoir material.

In addition, in accordance with embodiments of the disclosure, a method of forming a resistive memory element comprises forming an active material comprising a solid state electrolyte material over a first electrode. A buffer material comprising longitudinally extending, columnar grains of crystalline material is formed over the active material. An ion reservoir material is formed over the buffer material. A second electrode is formed over the ion reservoir material.

Figure 2:
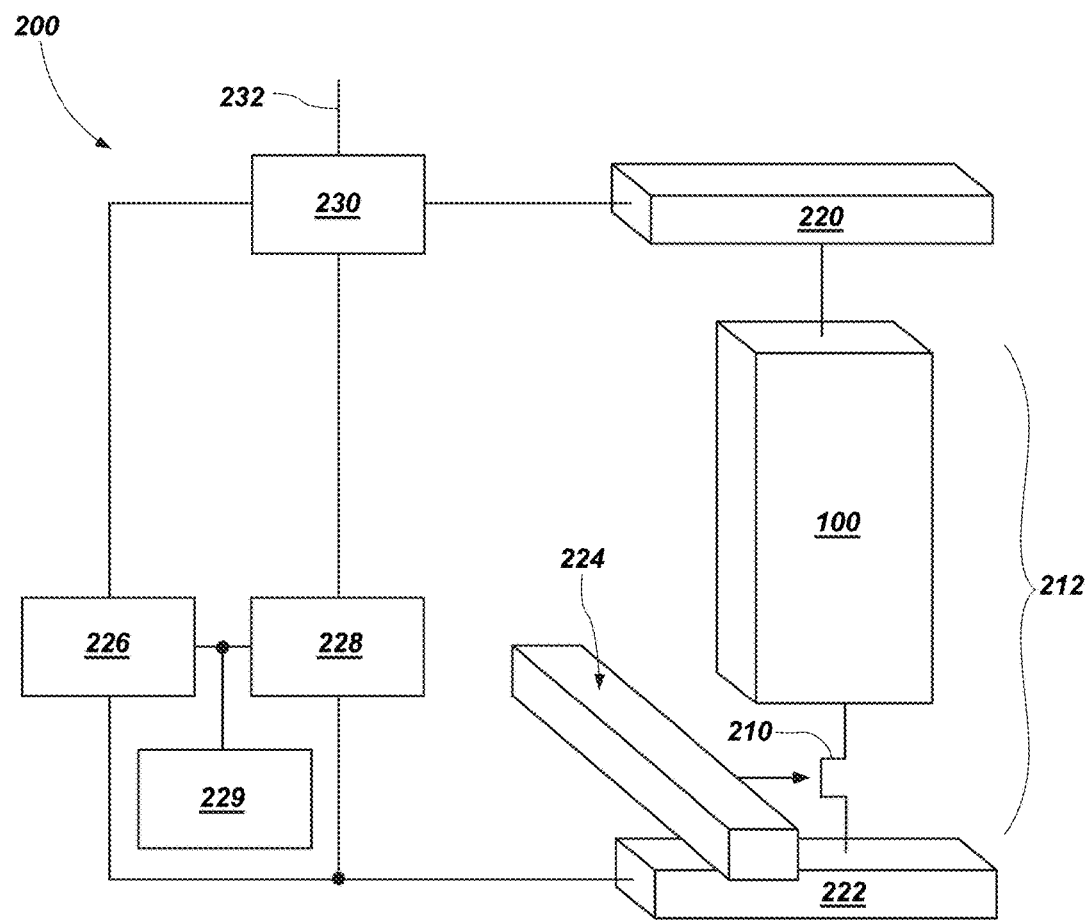
FIG. 2 is a functional block diagram of a memory device, in accordance with an embodiment of the disclosure.

FIG. 2 illustrates a functional block diagram of a memory device 200 in accordance with an embodiment of the disclosure. The memory device 200 may include at least one memory cell 212 between at least one data/sense line, for example, a bit line 220, and at least one source line 222. The memory cell 212 may include an access device 210 coupled or connected in series with the resistive memory element 100 previously described above. The access device 210 may act as a switch for enabling and disabling current flow through the resistive memory element 100. By way of non-limiting example, the access device 210 may be a transistor (e.g., a field-effect transistor, a bipolar junction transistor, etc.) with a gate connected to an access line, for example, a word line 224. The word line 224 may extend in a direction substantially perpendicular to that of the bit line 220. The bit line 220 and the source line 222 may be connected to logic for programming and reading the resistive memory element 100. A control multiplexer 230 may have an output connected to the bit line 220. The control multiplexer 230 may be controlled by a control logic line 232 to select between a first input connected to a pulse generator 226, and a second input connection to read-sensing logic 228.

During a programming operation, a voltage greater than a threshold voltage of the access device 210 may be applied to the word line 224 to turn on the access device 210. Turning on the access device 210 completes a circuit between the source line 222 and the bit line 220 by way of the resistive memory element 100. After turning on the access device 210, a bias generator 229 may establish, by way of the pulse generator 226, a bias voltage potential difference between the bit line 220 and the source line 222. Referring to FIG. 1, if a forming bias voltage or a set bias voltage is established, metal cations migrate from the ion reservoir material 108, through the buffer material 106, and into the active material 104 to form conductive filaments in at least the active material 104. The conductive filaments reduce the resistivity of the resistive memory element 100. Conversely, if a reset bias voltage is established, metal cations migrate from the active material 104, through the buffer material 106, and back into the ion reservoir material 108 to remove the conductive filaments therein and increase the resistivity of the resistive memory element 100.

Referring again to FIG. 2, during a read operation, the bias generator 229 may establish, by way of read-sensing logic 228, a read bias voltage potential difference between the bit line 220 and the source line 222. The read bias voltage may be lower than the reset bias voltage. The read bias voltage enables current to flow through the resistive memory element 100 according to a resistance state of the active material 104 (FIG. 1). For example, for a given read bias voltage, if the active material 104 is in a high-resistance state (e.g., a reset state), a relatively smaller current flows through the resistive memory element 100 than if the active material 104 is in a low-resistance state (e.g., a set state). The amount of current flowing through resistive memory element 100 during the read operation may be compared to a reference input by the read-sensing logic 228 (e.g., a sense amplifier) to discriminate whether the data stored in the resistive memory cell 212 is a logic "1" or a logic "0."

Thus, in accordance with embodiments of the disclosure, a memory device comprises a word line, a bit line, a source line, and a memory cell between the bit line and the source line. The memory cell comprises an access device coupled to the word line, and a resistive memory element between the access device and the bit line. The resistive memory element comprises a conductive material, an active material over the conductive material and comprising one or more of a metal oxide and a chalcogenide compound, a buffer material over the active material and comprising longitudinally extending columnar grains of at least one crystalline material, an ion reservoir material over the active material and comprising one or more of Cu, Ag, and Al, and another conductive material over the ion reservoir material.

In addition, in accordance with embodiments of the disclosure, a memory cell comprises an access device, and a resistive memory element coupled to the access device and comprising a solid state electrolyte material overlying a conductive material, an ion reservoir material overlying the solid state electrolyte material, and a buffer material comprising columnar grains of crystalline material longitudinally extending between the solid state electrolyte material and the ion reservoir material.

Figure 3:
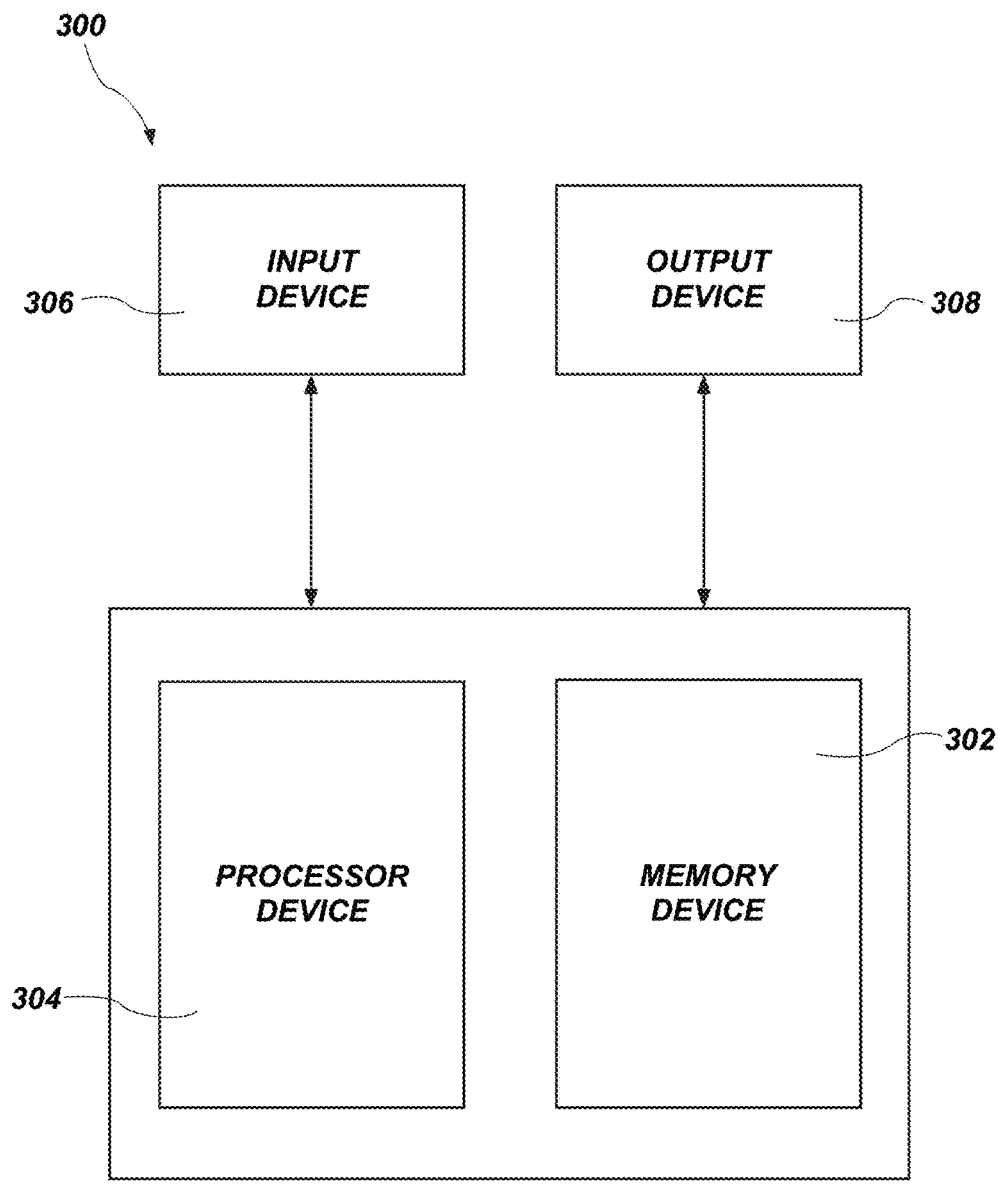
FIG. 3 is a schematic block diagram of an electronic system, in accordance with an embodiment of the disclosure.

Memory devices (e.g., the memory device 200) that include resistive memory elements (e.g., the resistive memory element 100) according to embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a WiFi or cellular-enabled tablet such as, for example, an iPad® or SURFACE® tablet, an electronic book, a navigation device, etc. The electronic system 300 includes at least one memory device 302. The at least one memory device 302 may include, for example, an embodiment of the memory device 200 shown in FIG. 2. The electronic system 300 may further include at least one electronic signal processor device 304 (often referred to as a "microprocessor"). The electronic signal processor device 304 may, optionally, include a memory structure substantially similar to an embodiment of the resistive memory element 100 shown in FIG. 1. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user, such as, for example, a monitor, a display, a printer, an audio output jack, a speaker, etc. In some embodiments, the input device 306 and the output device 308 may comprise a single touch screen device that can be used both to input information to the electronic system 300 and to output visual information to a user. The one or more input devices 306 and output devices 308 may communicate electrically with at least one of the memory device 302 and the electronic signal processor device 304.

Thus, in accordance with embodiments of the disclosure, an electronic system comprises a memory device in communication with at least one of an electronic signal processor device, an input device, and an output device. The memory device includes a resistive memory element comprising an active material comprising at least one solid state electrolyte material between a first conductive material and a second conductive material, an ion reservoir material between the active material and the second conductive material, and a buffer material comprising columnar grains of a crystalline material directly physically contacting and vertically extending between the active material and the ion reservoir material.

The buffer materials, resistive memory elements, memory cells, and methods of the disclosure facilitate enhanced performance, reliability, and durability as compared to conventional buffer materials, conventional resistive memory elements, conventional memory cells, and conventional methods. The buffer materials (e.g., the buffer material 106) of the disclosure facilitate the controlled migration of metal cations into and from an active material (e.g., the active material 104) along longitudinally extending interstitial spaces between longitudinally extending columnar grains of crystalline material, resulting in the relatively more consistent formation (and, optionally, subsequent removal) of multiple conductive filaments within the active material as compared to resistive memory elements including conventional buffer materials. The buffer materials of the disclosure may reduce variability in and increase the quantity of conductive filaments formed within the active material as compared to conventional buffer materials, reducing the likelihood of diminished resistive memory element (and, hence, associated memory cell, memory device, and electronic system) performance and/or reliability due to deficiencies in any single conductive filament. The relatively increased quantity of parallel metal cation diffusion pathways per unit area of the buffer material may, for example, facilitate relatively faster transmission of the metal cations and may also reduce the likelihood of a failure to sufficiently switch resistivity states of the active material of the resistive memory device resulting from the failure of a single diffusion pathway of the buffer material. In addition, the material properties (e.g., physical state, such as crystalline state; thermal stability) of the various components (e.g., columnar grains of crystalline material, electrolyte material (if any)) of the buffer materials of the disclosure, may reduce resistive memory element damage (e.g., resulting from phase separation of different resistive memory element components due to material constituents switching between different physical states) and increase resistive memory element thermal budget relative to conventional resistive memory elements including conventional buffer materials, resulting in relatively enhanced resistive memory element (and, hence, associated memory cell, memory device, and electronic system) durability (e.g., cycling endurance).

The following example serves to explain embodiments of the disclosure in more detail. The example is not to be construed as being exhaustive or exclusive as to the scope of the disclosure.

EXAMPLE

Figure 4A:
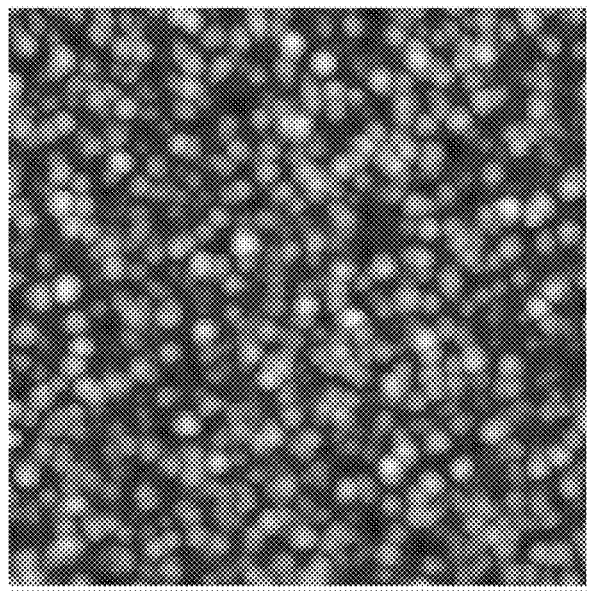
FIGS. 4A-4C are an atomic force micrograph (AFM) (FIG. 4A) and scanning electron micrographs (SEMs) (FIGS. 4B and 4C) showing top-down (FIGS. 4A and 4B) and side-elevation (FIG. 4C) views of a buffer material for a resistive memory element, as described below in Example 1.
Figure 4B:
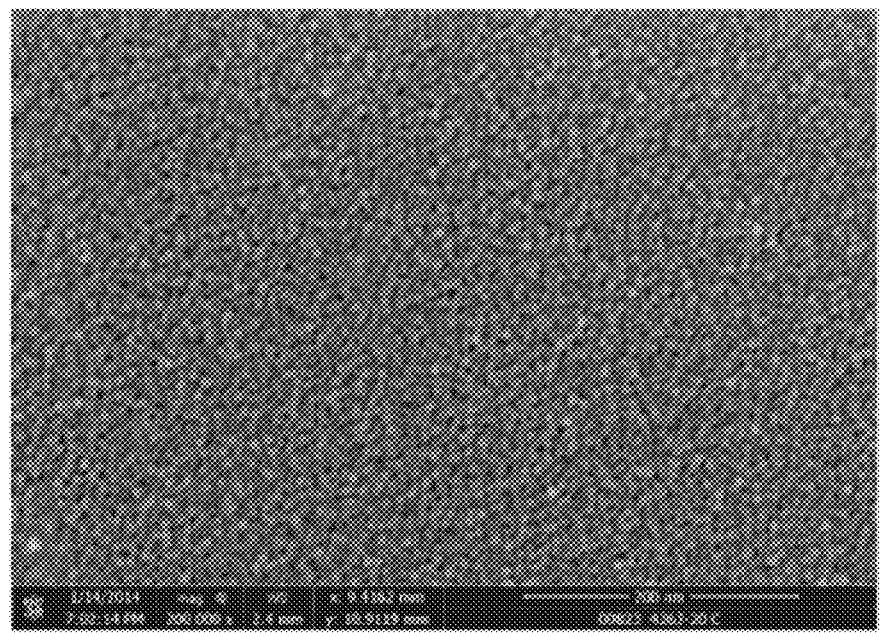
Figure 4C:
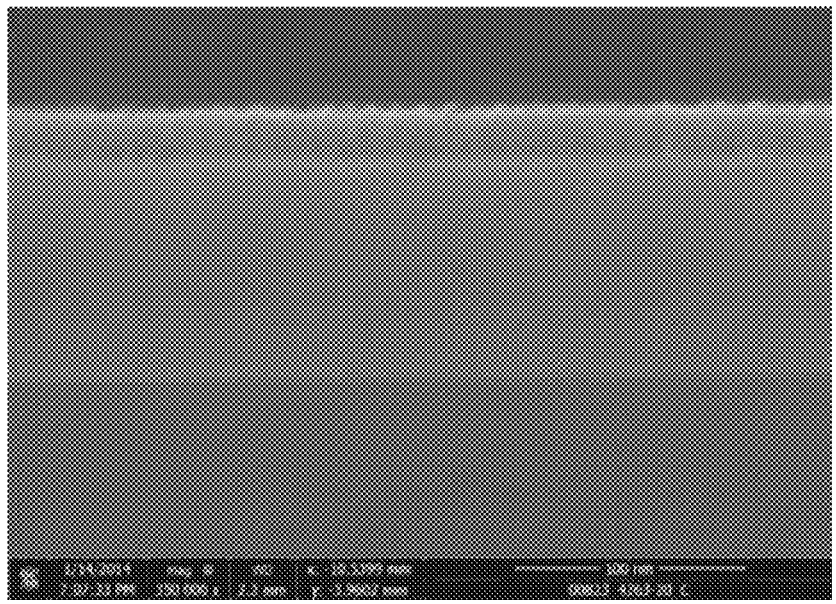
Figure 5A:
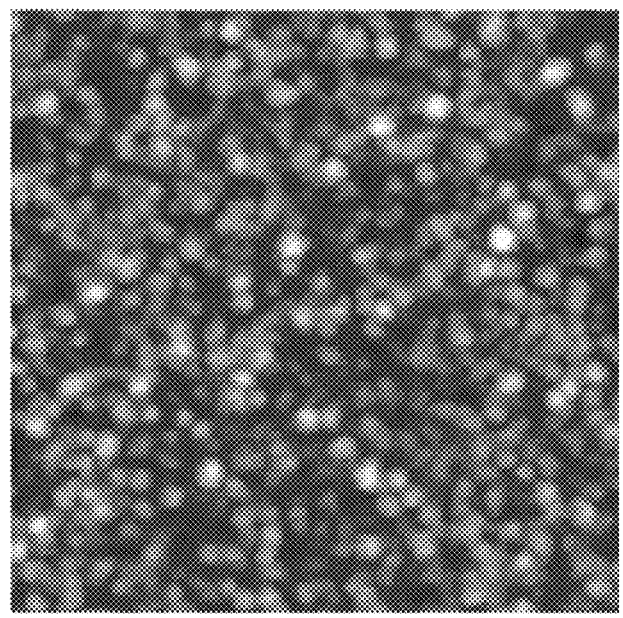
FIGS. 5A-5C are an AFM (FIG. 5A) and SEMs (FIGS. 5B and 5C) showing top-down (FIGS. 5A and 5B) and side-elevation (FIG. 5C) views of another buffer material for a resistive memory element, as also described below in Example 1.
Figure 5B:
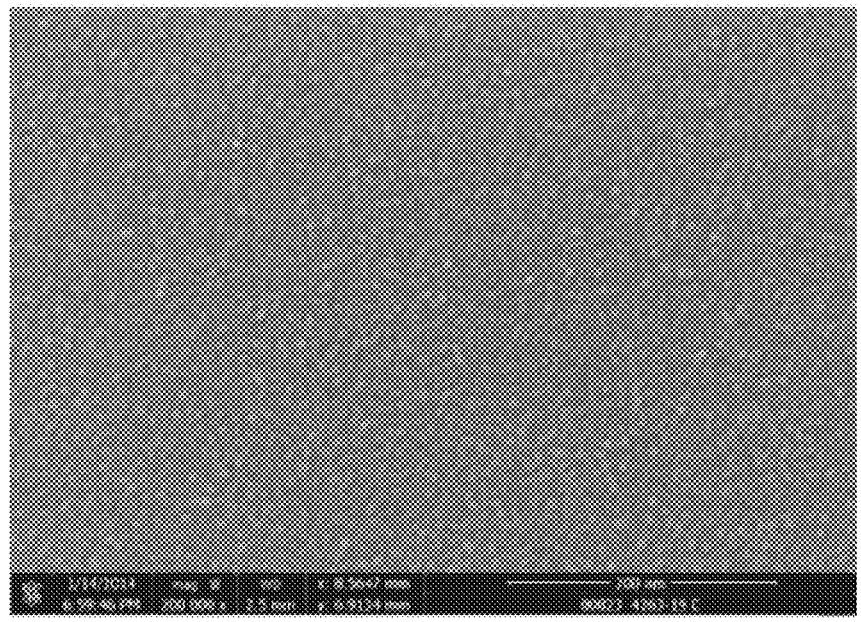
Figure 5C:
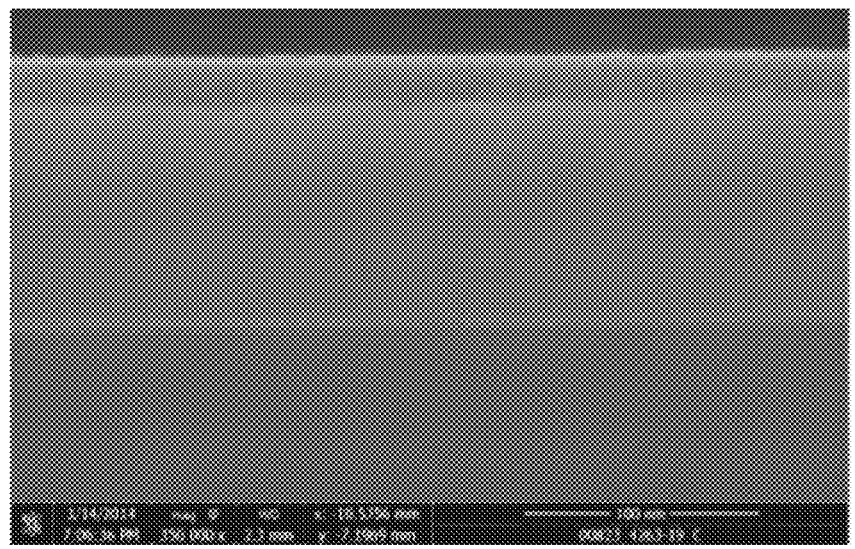
Figure 6A:
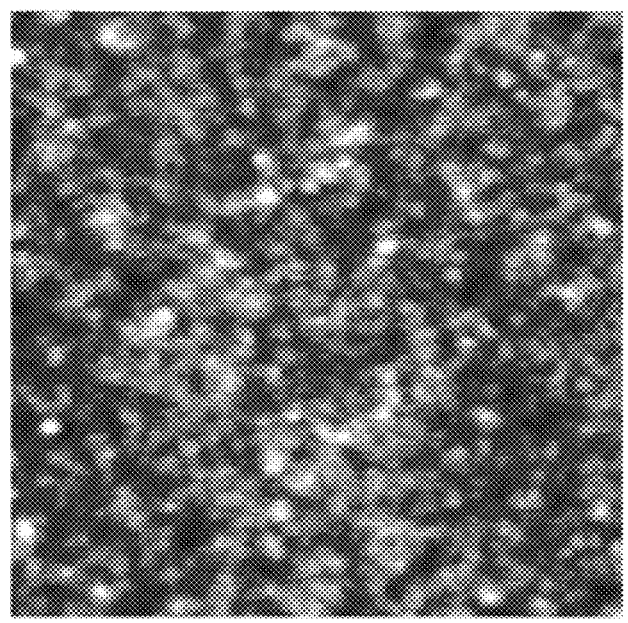
FIGS. 6A-6C are an AFM (FIG. 6A) and SEMs (FIGS. 6B and 6C) showing top-down (FIGS. 6A and 6B) and side-elevation (FIG. 6C) views of an additional buffer material for a resistive memory element, as also described below in Example 1.
Figure 6B:
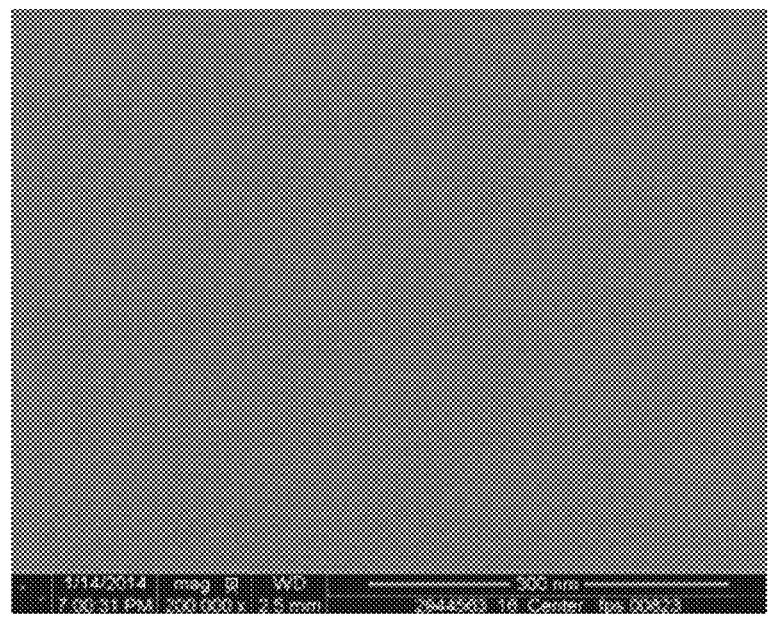
Figure 6C:
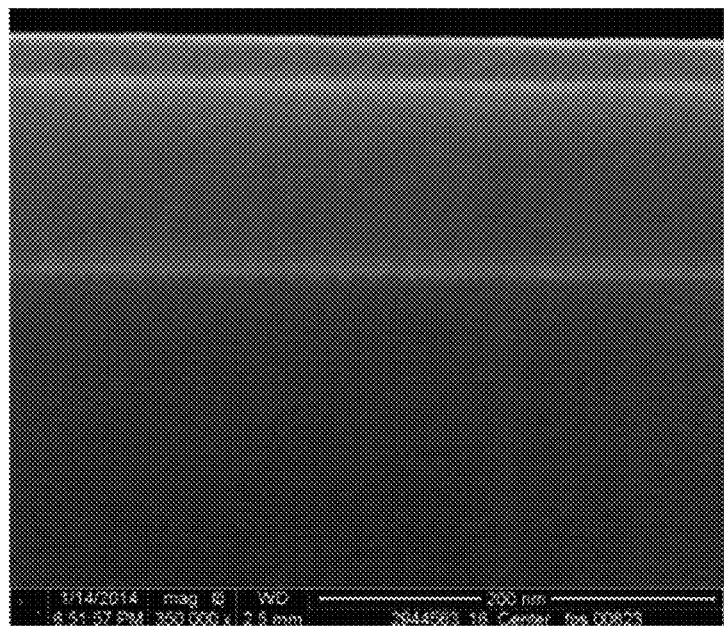

Example 1: Structural Analysis of Different Buffer Materials for Resistive Memory Elements Three different buffer material samples were subjected to structural analysis. A first buffer material sample was formed of and included $TiN_x$. A second buffer material sample was formed of and included $TiN_xC_y$, exhibiting about 5 atomic % C. A third buffer material sample was formed of and included $TiN_xC_y$, exhibiting about 10 atomic % C. FIGS. 4A-4C are an atomic force micrograph (AFM) (FIG. 4A) and scanning electron micrographs (SEMs) (FIGS. 4B and 4C) showing top-down (FIGS. 4A and 4B) and side-elevation (FIG. 4C) views of the first buffer material sample. FIGS. 5A-5C are an AFM (FIG. 5A) and SEMs (FIGS. 5B and 5C) showing top-down (FIGS. 5A and 5B) and side-elevation (FIG. 5C) views of the second buffer material sample. FIGS. 6A-6C are an AFM (FIG. 6A) and SEMs (FIGS. 6B and 6C) showing top-down (FIGS. 6A and 6B) and side-elevation (FIG. 6C) views of the third buffer material sample. As shown in FIGS. 4A-6C, each of the different buffer material samples exhibited longitudinally extending columnar grains defining longitudinally extending interstitial spaces. Moreover, the relatively increased carbon content of the second buffer material sample and the third buffer material sample resulted in corresponding reductions in columnar grain diameter, facilitating relatively increased quantities of longitudinally extending interstitial spaces per unit area as compared to buffer material samples having relatively decreased carbon content. Composites of an electrolyte material (e.g., a chalcogen, such as Te) and $TiN_x$, $TiN_xC_y$ exhibiting about 5 atomic % C, or $TiN_xC_y$ exhibiting about 10 atomic % C are expected to exhibit columnar grain diameters substantially similar to those of $TiN_x$, $TiN_xC_y$ exhibiting about 5 atomic % C, or $TiN_xC_y$ exhibiting about 10 atomic % C, respectively.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:
1. A method of forming a resistive memory element, comprising:

forming an active material comprising a solid state electrolyte material over a first electrode;
forming a buffer material comprising longitudinally extending, columnar grains of crystalline material over the active material;
forming an ion reservoir material over the buffer material; and
forming a second electrode over the ion reservoir material.

2. The method of claim 1, wherein forming a buffer material comprises forming one or more of a refractory metal nitride, a composite of a refractory metal nitride and a chalcogen, a refractory metal nitrogen carbide, a composite of a refractory metal nitrogen carbide and a chalcogen, a refractory metal nitrogen bromide, a composite of a refractory metal nitrogen bromide and a chalcogen, a refractory metal nitrogen silicide, and a composite of a refractory metal nitrogen silicide and a chalcogen.

3. The method of claim 1, wherein forming a buffer material over the active material comprises forming the buffer material using one or more of physical vapor deposition, chemical vapor deposition, atomic layer deposition, and spin-coating.

4. The method of claim 1, wherein forming a buffer material comprises forming one or more of $TiN_x$, $TaN_x$, $WN_x$, $TiN_xC_y$, $TaN_xC_y$, and $WN_xC_y$ over the active material.

5. The method of claim 1, wherein forming a buffer material comprises forming one or more of $TiN_x$ and $TiN_xC_y$ over the active material.

6. The method of claim 1, wherein forming a buffer material comprises forming the buffer material to comprise a stack of at least two different materials each independently selected from the group consisting of $TiN_x$, $TaN_x$, $WN_x$, $TiN_xC_y$, $TaN_xC_y$, and $WN_xC_y$.

7. The method of claim 1, wherein forming a buffer material comprises forming a refractory metal nitrogen carbide comprising from about 0.1 atomic % C to about 25 atomic % C over the active material.

8. The method of claim 1, wherein forming a buffer material comprises forming the buffer material to further comprise at least one chalcogen within interstitial spaces between the longitudinally extending, columnar grains of crystalline material.

9. The method of claim 1, wherein forming the buffer material comprises forming the buffer material to further comprise Te along grain boundaries of the longitudinally extending, columnar grains of crystalline material.

10. A method of forming a resistive memory element, comprising:
forming a buffer material on a solid state electrolyte material overlying an electrode, the buffer material comprising longitudinally extending, columnar grains of crystalline material having an average diameter within a range of from about 3 nm to about 20 nm;
forming an ion reservoir material on the buffer material; and
forming another electrode over the ion reservoir material.

11. The method of claim 10, wherein forming a buffer material on a solid state electrolyte material comprises forming the buffer material on one or more of a chalcogenide material, a transition metal oxide, a dielectric metal oxide, and a mixed valence oxide including two or more metals.

12. The method of claim 10, wherein forming a buffer material on a solid state electrolyte material comprises forming each of the longitudinally extending, columnar grains of crystalline material to exhibit substantially the same grain size.

13. The method of claim 10, wherein forming a buffer material on a solid state electrolyte material comprises forming at least one of the longitudinally extending, columnar grains of crystalline material to exhibit a different grain size than at least one other of the longitudinally extending, columnar grains of crystalline material.

14. The method of claim 10, wherein forming a buffer material on a solid state electrolyte material comprises forming the buffer material to be heterogeneous throughout a thickness thereof.

15. The method of claim 10, wherein forming an ion reservoir material on the buffer material comprises forming a material comprising one or more of a Cu, Ag, and Al on the buffer material.

16. The method of claim 15, wherein forming a material comprising one or more of a Cu, Ag, and Al on the buffer material comprises forming the material to further comprise one or more of Te, Ge, and Si.

* * * * *